(12) United States Patent
Campos

(10) Patent No.: US 11,488,884 B2
(45) Date of Patent: Nov. 1, 2022

(54) ELECTRONIC DEVICE COMPRISING AN ELECTRONIC CHIP MOUNTED ON TOP OF A SUPPORT SUBSTRATE

(71) Applicant: STMicroelectronics (Grenoble 2) SAS, Grenoble (FR)

(72) Inventor: Didier Campos, Charavines (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 120 days.

(21) Appl. No.: 16/889,112

(22) Filed: Jun. 1, 2020

(65) Prior Publication Data
US 2020/0381328 A1 Dec. 3, 2020

(51) Int. Cl.
| | |
|---|---|
| H01L 23/367 | (2006.01) |
| H01L 23/31 | (2006.01) |
| H01L 23/522 | (2006.01) |
| H01L 23/36 | (2006.01) |

(52) U.S. Cl.
CPC .......... *H01L 23/367* (2013.01); *H01L 23/31* (2013.01); *H01L 23/36* (2013.01); *H01L 23/3677* (2013.01); *H01L 23/5226* (2013.01)

(58) Field of Classification Search
CPC ....... H01L 23/31; H01L 23/36; H01L 23/367; H01L 23/3672; H01L 23/3677
See application file for complete search history.

(56) References Cited

U.S. PATENT DOCUMENTS

| | | | | |
|---|---|---|---|---|
| 2007/0042534 A1* | 2/2007 | Lu | ............................ | H01L 24/83 438/123 |
| 2008/0224276 A1* | 9/2008 | Yang | .................. | H01L 23/49827 257/659 |
| 2009/0039533 A1* | 2/2009 | Lin | .................... | H01L 23/49838 438/118 |
| 2011/0001162 A1* | 1/2011 | Nakayama | ............ | C04B 35/119 257/E33.059 |
| 2012/0061849 A1 | 3/2012 | Coffy et al. | | |

OTHER PUBLICATIONS

INPI Search Report and Written Opinion for FR Appl. No. 1905858 dated Jan. 24, 2020 (8 pages).

* cited by examiner

*Primary Examiner* — Allan R Wilson
(74) *Attorney, Agent, or Firm* — Crowe & Dunlevy

(57) ABSTRACT

A support substrate has a mounting face with a metal heat transfer layer. Holes are provided to extend at least partially through the metal heat transfer layer. Metal heat transfer elements are disposed in the holes of the metal heat transfer layer of the support substrate. An electronic integrated circuit (IC) chip has a rear face that is fixed to the mounting face of the support substrate via a layer of adhesive material. The metal heat transfer elements disposed in the holes of the metal layer of the support substrate extend to protrude, relative to the mounting face of the support substrate, into the layer of adhesive material.

40 Claims, 2 Drawing Sheets

ELECTRONIC DEVICE COMPRISING AN ELECTRONIC CHIP MOUNTED ON TOP OF A SUPPORT SUBSTRATE

PRIORITY CLAIM

This application claims the priority benefit of French Application for Patent No. 1905858, filed on Jun. 3, 2019, the content of which is hereby incorporated by reference in its entirety to the maximum extent allowable by law.

TECHNICAL FIELD

The present invention relates to the field of the electronic devices that comprise integrated circuit (IC) chips mounted on support substrates.

BACKGROUND

In the case where the IC chips produce heat, it is advantageous to transfer a portion of the heat produced to the support substrates.

SUMMARY

According to one embodiment, an electronic device is proposed which comprises a support substrate having a facing mounting face and an electronic chip of which a rear face is fixed onto the facing mounting face of the support substrate via a layer of an adhesive material (such as a glue).

The support substrate includes a metal heat transfer layer on the side of its mounting face, opposite the chip, and having a plurality of holes.

The electronic device further comprises a plurality of metal heat transfer elements disposed in the holes of the metal layer of the support substrate and extending protruding, relative to the mounting face of the support substrate, into the layer of adhesive material.

Thus, the transfers of heat between the chip and the support substrate are increased.

The support substrate and the chip can advantageously be free of electrical connections via the metal heat transfer layer and the metal heat transfer elements.

The heat transfer elements can be at a distance from the rear face of the chip.

The support substrate can include an integrated network of electrical connections having front electrical connection blocks on the side of the facing mounting face of the support substrate, electrical connection means linking the chip and the front blocks of the network of electrical connections of the support substrate.

The metal heat transfer layer and the front electrical connection blocks can be disposed in one and the same metal level of the support substrate.

The electrical connection means can comprise metal wires linking front blocks of the support substrate and front blocks of a front face of the chip.

The device can comprise an encapsulation block on top of the facing face of the support substrate, in which the chip and the electrical connection means are embedded.

Also proposed is a method for fabricating an electronic device, which comprises the following steps: obtaining a support substrate having a mounting face and including a metal heat transfer layer on the side of this mounting face; producing holes in the metal heat transfer layer; placing metal heat transfer elements in the holes of the metal heat transfer layer, the metal heat transfer elements extending protruding relative to the mounting face of the support substrate; performing a brazing heat treatment of the metal heat transfer elements in the holes of the metal heat transfer layer; depositing a layer of adhesive material on top of the mounting face of the support substrate, in which the protruding parts of the heat transfer elements protruding relative to the mounting face of the support substrate are embedded; and placing an electronic integrated circuit (IC) chip on top of the layer of adhesive material so as to fix the chip on top of the support substrate.

The method can comprise the following subsequent step: placing connection wires between the IC chip and the support substrate.

The method can comprise the following subsequent step: producing an encapsulation block on top of the support substrate, in which the IC chip is embedded.

BRIEF DESCRIPTION OF THE DRAWINGS

An electronic device will now be described by way of non-limiting exemplary embodiment, illustrated by the drawing in which.

DETAILED DESCRIPTION

Figure 1:
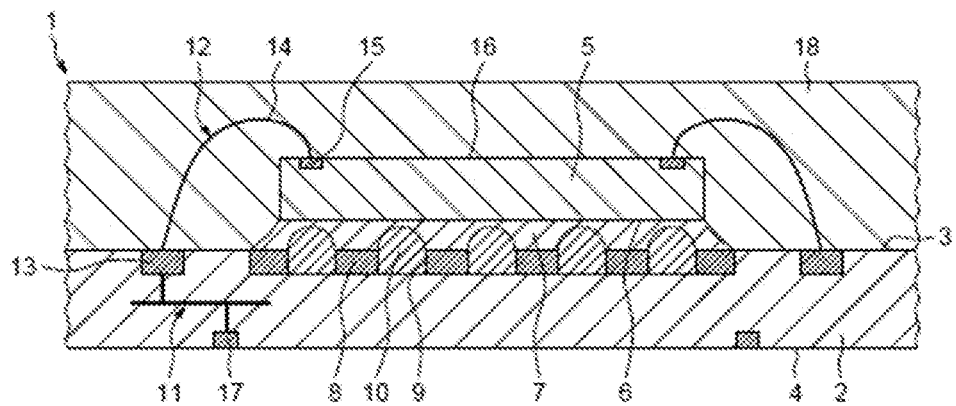
FIG. 1 shows a cross section of an electronic device.

An electronic device 1 illustrated in FIG. 1 comprises a support substrate 2 which has a mounting face 3 and a rear face 4 and an electronic integrated circuit (IC) chip 5 having a rear face 6 that is fixed onto the mounting face 3 of the support substrate via a layer of an adhesive material (such as glue) 7.

The support substrate 2 is provided with a metal heat transfer layer 8 which is attached to the support substrate 2 on the side of its mounting face 3, and which extends opposite at least a part of the rear face 6 of the IC chip 5 and which possibly extends beyond at least a part of the peripheral edge of the IC chip 5. Advantageously, the metal heat transfer layer extends opposite the entire rear face 6 of the IC chip 5 and beyond the entire periphery of the IC chip 5.

The metal layer 8 at the mounting face of the support substrate 2 has a plurality of holes 9 which are opposite and open on the side of the rear face 6 of the IC chip 5. The holes 9 can be produced to extend only partially though the thickness of the metal layer 8 or extend completely (entirely) through the thickness of the metal layer 8.

The electronic device 1 comprises a plurality of metal heat transfer elements 10, in the approximate form of balls, which are fitted into the holes 9 of the metal layer 8 and which include a portion that protrudes relative to the facing face 3 of the support substrate 2 so that the protruding parts of the heat transfer elements extend above the upper surface of the metal layer and are embedded in the layer of adhesive material 7.

The heat transfer elements 10 include a portion which at least partially fills the holes 9 and are linked (attached) to the metal layer 8 by brazing. Advantageously, the top surfaces of the heat transfer elements 10, which in an embodiment present an outer domed surface shape, are spaced at a distance from the rear face 6 of the IC chip 5.

The support substrate 2 and the IC chip 5 are free of electrical connections via the metal heat transfer layer 8 and the metal heat transfer elements 10. The heat transfer elements 10 therefore have no electrical connection function between the IC chip 5 and the support substrate 2.

A portion of the heat produced by the IC chip 5 is transferred to the support substrate 2 via the layer of adhesive material 7. By virtue of the existence of the metal heat transfer layer 8 and of the metal heat transfer elements 10, the flow of heat between the IC chip 5 and the support substrate 2 is considerably increased.

The holes 9 and consequently the metal heat transfer elements 10 can be evenly distributed or, possibly, be more dense in the zone or zones of the IC chip 5 that produce the most heat.

The support substrate 2 is provided with an integrated network of electrical connections 11 which is linked to the IC chip 5 by electrical connection means 12 (provided, for example, in the form of bonding wires).

The metal heat transfer layer 8 and the metal heat transfer elements 10 on the one hand and the integrated network of electrical connections 11 and the electrical connection means 12 on the other hand are distinct.

According to a variant embodiment, the integrated network of electrical connections 11 comprises front electrical connection blocks 13 on the side of the facing face 3 of the support substrate 2. The front blocks are formed beyond and at a distance from the peripheral edge of the IC chip 5 and at a distance from the metal heat transfer layer 8.

The electrical connection means 12 comprise electrical wires 14 which link the front electrical connection blocks 13 and front electrical connection blocks 15 of the front face 16 of the IC chip 5.

The integrated network of electrical connections 11 comprises rear electrical connection blocks 17 on the side of the rear face 4 of the support substrate 2, in order to connect the IC chip 5 to the outside.

Advantageously, the metal heat transfer layer 8 and the front electrical connection blocks 13 are formed in one and the same metal level of the support substrate 2. In this configuration, top surfaces of the metal heat transfer layer 8 and front electrical connection blocks 13 may be coplanar with surface 3 of the substrate 2. The metal heat transfer elements 10 extend above this coplanar surface.

The result of the above is that, in light of the mounting of the IC chip 5 on the support substrate 2 and of the electrical connection means 12 between the IC chip 5 and the support substrate 2, the metal layer 8 and the elements 10 constitute additional, exclusively heat-transfer oriented means.

The electronic device 1 further comprises an encapsulation block 18 on top of the facing face 3 of the support substrate, in which the chip 5 and the electrical wires 14 are embedded.

The electronic device 1 can be fabricated as follows.

Figure 2:
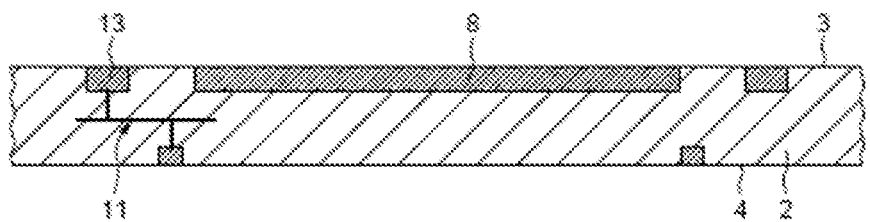
FIG. 2 shows a step of fabrication of the electronic device of FIG. 1.

As illustrated in FIG. 2, a support substrate 2 is obtained that is provided with the metal heat transfer layer 8 and the network of electrical connections 11.

Figure 3:
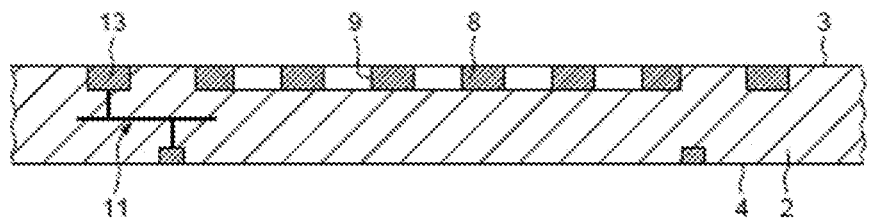
FIG. 3 shows a subsequent step of fabrication of the electronic device of FIG. 1.

In a fabrication step illustrated in FIG. 3, the holes 9 are produced in the metal heat transfer layer 8, by drilling or etching.

Figure 4:
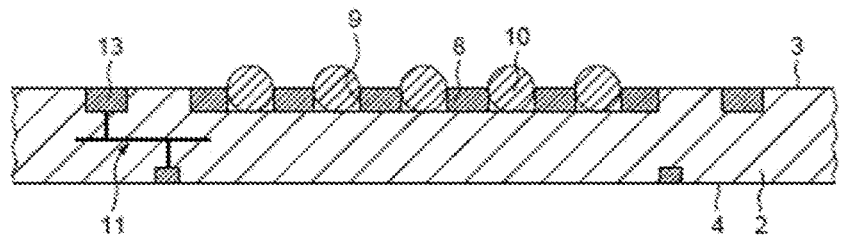
FIG. 4 shows a subsequent step of fabrication of the electronic device of FIG. 1.

In a subsequent fabrication step illustrated in FIG. 4, the metal heat transfer elements 10 are placed in the holes 9.

Figure 5:
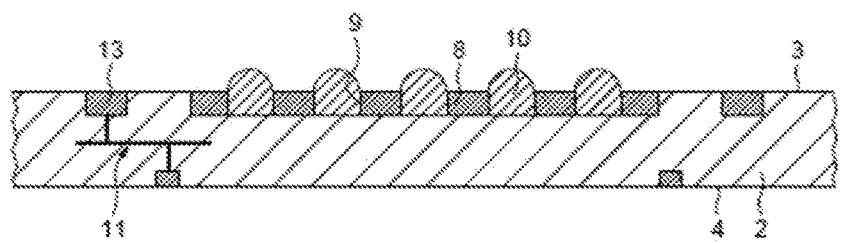
FIG. 5 shows a subsequent step of fabrication of the electronic device of FIG. 1.

In a subsequent fabrication step illustrated in FIG. 5, a heat treatment is performed, for example in an oven, so as to fix the metal heat transfer elements 10 by brazing to the metal heat transfer layer 8. In response to the heat treatment, the material forming the metal heat transfer elements 10 creeps so as to, advantageously, provide a portion which fills the holes 9 and provide another portion which protrudes from the holes.

Figure 6:
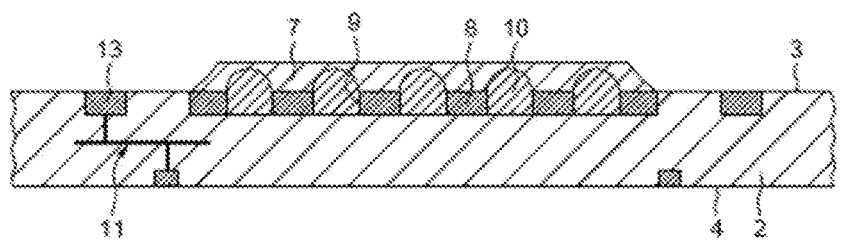
FIG. 6 shows a subsequent step of fabrication of the electronic device of FIG. 1.

In a subsequent fabrication step illustrated in FIG. 6, the layer of adhesive material (for example, glue) 7 is deposited, the protruding portions of the metal heat transfer elements 10 then being embedded in this layer of adhesive material 7.

Figure 7:
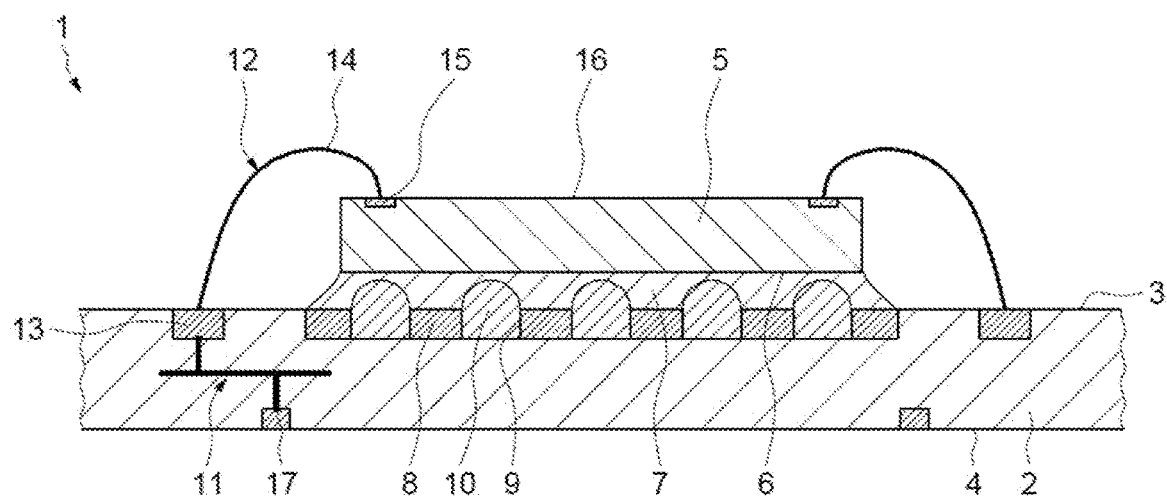
FIG. 7 shows a subsequent step of fabrication of the electronic device of FIG. 1.

In a subsequent fabrication step illustrated in FIG. 7, the IC chip 5 is placed on top of the layer of adhesive material 7 and the adhesive material is hardened so as to fix the IC chip 5 on top of the support substrate 2. Then, the electrical connection wires 14 are put in place.

Finally, the encapsulation block 18 is formed.

The electronic device 1 is then obtained.

The invention claimed is:

1. An electronic device, comprising:
   a support substrate having a mounting face;
   an integrated circuit (IC) chip having a rear face fixed to the mounting face of the support substrate by a layer of adhesive material;
   wherein the support substrate includes a metal heat transfer layer at said mounting face, said metal heat transfer layer including a plurality of holes; and
   a plurality of metal heat transfer elements disposed in the plurality of holes of the metal heat transfer layer, said plurality of metal heat transfer elements extending to protrude, relative to the mounting face of the support substrate, into the layer of adhesive material;
   wherein surfaces of the plurality of metal heat transfer elements are spaced by a distance from the rear face of the IC chip.

2. The electronic device according to claim 1, wherein the support substrate includes an integrated network of electrical connections and the IC chip is not electrically connected to the integrated network of electrical connections via the metal heat transfer layer and the plurality of metal heat transfer elements.

3. The electronic device according to claim 1, wherein portions of the layer of adhesive material fills said distance between the metal heat transfer elements and the rear face of the IC chip.

4. The electronic device according to claim 1, wherein the support substrate includes an integrated network of electrical connections having front electrical connection blocks at the mounting face of the support substrate.

5. The electronic device according to claim 4, wherein the metal heat transfer layer and the front electrical connection blocks are at a same metal level of the support substrate.

6. The electronic device according to claim 4, further comprising electrical connection means linking the IC chip and the front electrical connection blocks.

7. The electronic device according to claim 6, wherein the electrical connection means comprise metal wires linking the front electrical connection blocks to front blocks of a front face of the IC chip.

8. The electronic device according to claim 6, further comprising an encapsulation block on top of the mounting face of the support substrate and within which the IC chip and the electrical connection means are embedded.

9. The electronic device according to claim 4, wherein top surfaces of the front electrical connection blocks and the metal heat transfer layer are coplanar with the mounting face of the support substrate.

10. The electronic device according to claim 1, wherein the plurality of holes extend completely through the metal heat transfer layer.

11. The electronic device according to claim 1, wherein the adhesive material is glue.

12. The electronic device according to claim 1, wherein each metal heat transfer element includes a first portion disposed in one of the plurality of holes and a second portion which extends out of said one of the plurality of holes to protrude above the mounting face of the metal heat transfer layer and into the layer of adhesive material.

13. An electronic device, comprising:
- a support substrate having a front face with electrical connection pads;
- a metal heat transfer layer in the support substrate, wherein the metal heat transfer layer has a mounting face coplanar with the front face and further includes a plurality of holes which extend through the metal heat transfer layer from the mounting face to a rear face of the metal heat transfer layer; and
- a plurality of metal heat transfer elements mounted within the plurality of holes of the metal heat transfer layer, each metal heat transfer element including a first portion disposed in the hole and a second portion which extends out of the hole to protrude above the mounting face of the metal heat transfer layer.

14. The electronic device according to claim 13, further comprising an integrated circuit (IC) chip having a rear face attached to the mounting face of the support substrate by a layer of adhesive material, wherein the second portion of each metal heat transfer element protrudes into the layer of adhesive material.

15. The electronic device according to claim 14, wherein an outer surface of each metal heat transfer element is spaced by a distance from the rear face of the IC chip, and wherein the adhesive material fills said distance.

16. The electronic device according to claim 14, further comprising bonding wires electrically connecting the IC chip to the electrical connection pads at the front face of the support substrate.

17. The electronic device according to claim 14, further comprising an encapsulation block on top of the mounting face of the support substrate, wherein the encapsulation block encapsulates the IC chip.

18. The electronic device according to claim 13, wherein the second portion has an outer surface having a domed shape.

19. An electronic device, comprising:
- a support substrate having a mounting face, wherein the support substrate includes an integrated network of electrical connections having front electrical connection blocks at the mounting face of the support substrate;
- an integrated circuit (IC) chip having a rear face fixed to the mounting face of the support substrate by a layer of adhesive material;
- wherein the support substrate includes a metal heat transfer layer at said mounting face, wherein the metal heat transfer layer and the front electrical connection blocks are at a same metal level of the support substrate, said metal heat transfer layer including a plurality of holes; and
- a plurality of metal heat transfer elements disposed in the plurality of holes of the metal heat transfer layer, said plurality of metal heat transfer elements extending to protrude, relative to the mounting face of the support substrate, into the layer of adhesive material.

20. The electronic device according to claim 19, wherein the support substrate includes an integrated network of electrical connections and the IC chip is not electrically connected to the integrated network of electrical connections via the metal heat transfer layer and the plurality of metal heat transfer elements.

21. The electronic device according to claim 19, further comprising electrical connection means linking the IC chip and the front electrical connection blocks.

22. The electronic device according to claim 21, wherein the electrical connection means comprise metal wires linking the front electrical connection blocks to front blocks of a front face of the IC chip.

23. The electronic device according to claim 21, further comprising an encapsulation block on top of the mounting face of the support substrate and within which the IC chip and the electrical connection means are embedded.

24. The electronic device according to claim 19, wherein top surfaces of the front electrical connection blocks and the metal heat transfer layer are coplanar with the mounting face of the support substrate.

25. The electronic device according to claim 19, wherein the plurality of holes extend completely through the metal heat transfer layer.

26. The electronic device according to claim 19, wherein the adhesive material is glue.

27. An electronic device, comprising:
- a support substrate having a mounting face, wherein the support substrate includes an integrated network of electrical connections having front electrical connection blocks at the mounting face of the support substrate;
- an integrated circuit (IC) chip having a rear face fixed to the mounting face of the support substrate by a layer of adhesive material;
- wherein the support substrate includes a metal heat transfer layer at said mounting face, said metal heat transfer layer including a plurality of holes, wherein top surfaces of the front electrical connection blocks and the metal heat transfer layer are coplanar with the mounting face of the support substrate; and
- a plurality of metal heat transfer elements disposed in the plurality of holes of the metal heat transfer layer, said plurality of metal heat transfer elements extending to protrude, relative to the mounting face of the support substrate, into the layer of adhesive material.

28. The electronic device according to claim 27, wherein the support substrate includes an integrated network of electrical connections and the IC chip is not electrically connected to the integrated network of electrical connections via the metal heat transfer layer and the plurality of metal heat transfer elements.

29. The electronic device according to claim 27, further comprising electrical connection means linking the IC chip and the front electrical connection blocks.

30. The electronic device according to claim 29, wherein the electrical connection means comprise metal wires linking the front electrical connection blocks to front blocks of a front face of the IC chip.

31. The electronic device according to claim 29, further comprising an encapsulation block on top of the mounting face of the support substrate and within which the IC chip and the electrical connection means are embedded.

32. The electronic device according to claim 27, wherein the plurality of holes extend completely through the metal heat transfer layer.

33. The electronic device according to claim 27, wherein the adhesive material is glue.

34. An electronic device, comprising:
a support substrate having a mounting face;
an integrated circuit (IC) chip having a rear face fixed to the mounting face of the support substrate by a layer of adhesive material;
wherein the support substrate includes a metal heat transfer layer at said mounting face, said metal heat transfer layer including a plurality of holes, wherein the plurality of holes extend completely through the metal heat transfer layer; and
a plurality of metal heat transfer elements disposed in the plurality of holes of the metal heat transfer layer, said plurality of metal heat transfer elements extending to protrude, relative to the mounting face of the support substrate, into the layer of adhesive material.

35. The electronic device according to claim 34, wherein the support substrate includes an integrated network of electrical connections and the IC chip is not electrically connected to the integrated network of electrical connections via the metal heat transfer layer and the plurality of metal heat transfer elements.

36. The electronic device according to claim 34, wherein the support substrate includes an integrated network of electrical connections having front electrical connection blocks at the mounting face of the support substrate.

37. The electronic device according to claim 34, further comprising electrical connection means linking the IC chip and the front electrical connection blocks.

38. The electronic device according to claim 37, wherein the electrical connection means comprise metal wires linking the front electrical connection blocks to front blocks of a front face of the IC chip.

39. The electronic device according to claim 37, further comprising an encapsulation block on top of the mounting face of the support substrate and within which the IC chip and the electrical connection means are embedded.

40. The electronic device according to claim 34, wherein the adhesive material is glue.

* * * * *